United States Patent
Izumi et al.

(10) Patent No.: US 7,670,870 B2
(45) Date of Patent: Mar. 2, 2010

(54) METHOD OF MANUFACTURING ORGANIC THIN FILM TRANSISTOR AND ORGANIC THIN FILM TRANSISTOR

(75) Inventors: Tomoo Izumi, Toyonaka (JP); Masakazu Okada, Kyoto (JP)

(73) Assignee: Konica Minolta Holdings, Inc., Tokyo (JP)

( * ) Notice: Subject to any disclaimer, the term of this patent is extended or adjusted under 35 U.S.C. 154(b) by 454 days.

(21) Appl. No.: 11/803,992

(22) Filed: May 16, 2007

(65) Prior Publication Data

US 2007/0267630 A1  Nov. 22, 2007

(30) Foreign Application Priority Data

May 22, 2006  (JP)  .............................. 2006-141155

(51) Int. Cl.
*H01L 51/40* (2006.01)
(52) U.S. Cl. .................. 438/99; 257/40; 257/E21.114; 257/E51.005
(58) Field of Classification Search .................. 438/99; 257/40, E21.114, E51.005
See application file for complete search history.

(56) References Cited

U.S. PATENT DOCUMENTS

| 6,335,539 | B1 | 1/2002 | Dimitrakopoulos et al. |
| 6,569,707 | B2 | 5/2003 | Dimitrakopoulos et al. |
| 2007/0020798 | A1* | 1/2007 | Wu et al. ........................ 438/99 |
| 2007/0212807 | A1* | 9/2007 | Yamada et al. ................. 438/99 |
| 2009/0101892 | A1* | 4/2009 | Dimitrakopoulos et al. ... 257/40 |
| 2009/0159878 | A1* | 6/2009 | Nakamura et al. ............ 257/40 |

FOREIGN PATENT DOCUMENTS

JP        10-190001        7/1998

OTHER PUBLICATIONS

Dimitrakopoulos, Christos D. And Malenfant, Patrick R.L., "Organic Thin Film Transistors for Large Area Electronics," Advanced Materials 2002, 14, No. 2, Jan. 16, (Review), Wiley-VCH Verlag GmbH, Weinheim, pp. 99-117.

* cited by examiner

*Primary Examiner*—Trung Dang
(74) *Attorney, Agent, or Firm*—Brinks Hofer Gilson & Lione (57) ABSTRACT

A method of manufacturing an organic thin film transistor characterized by low costs and high performances, the method in which the self-assemble monolayer is formed in a short period of time, and the organic thin film transistor are provided. A method of manufacturing an organic thin film a transistor having a gate electrode, a semiconductor layer, a source electrode, and a drain electrode on a substrate, wherein a semiconductor solution as a mixture of the self-assembled monolayer material and organic semiconductor material is coated between the source electrode and drain electrode, whereby a semiconductor layer is formed.

20 Claims, 3 Drawing Sheets

METHOD OF MANUFACTURING ORGANIC THIN FILM TRANSISTOR AND ORGANIC THIN FILM TRANSISTOR

This application is based on Japanese Patent Application No. 2006-14115 filed on May 22, 2006, in Japanese Patent Office, the entire content of which is hereby incorporated by reference.

TECHNICAL FIELD

The present invention relates to an organic thin film transistor manufacturing method and an organic thin film transistor.

BACKGROUND

With the spread of an information terminal, there has been a growing demand for a flat panel display as a computer display. Further, the information having been provided in the form of paper is now given in the form of electronic paper in ever-increasing occasions, as a result of progress in the information technology. There has been an increasing need for electronic paper or digital paper as a mobile display medium characterized by lightweight and excellent portability. Against this backdrop, development of a flat panel display apparatus has been carried out.

Generally in the flat panel display apparatus, a display medium is produced by using a device based on the technology of liquid crystal, organic electroluminescence and electrophoresis. To ensure uniformity of the screen brightness and screen rewriting speed, such a display medium is manufactured according to the technology based on an active drive element made of an organic thin film transistor (hereinafter referred to as "organic TFT") as an image drive element.

In this case, in the production of the organic TFT element, a semiconductor thin film such as a-Si (amorphous silicon) and p-Si (polysilicon) and a thin metallic film such as a source, drain and gate electrode are sequentially formed on the glass substrate.

In the conventional practice, to form a bus line, electrode pattern and semiconductor layer on a substrate, patterning is carried out to form a circuit by the photolithographic technology (hereinafter referred to as "photolithography"). Photolithography is a technique wherein a photosensitive resist is coated on a thin film to be patterned, and the exposed thin film portion is dry- or wet-etched after exposure and development through a photo mask, whereby patterning is carried out. After patterning, the unwanted resist is stripped, and formation of films thereon is repeated to form a semiconductor layer.

As described above, the photolithography has been used to produce an organic TFT element. However, this involves a problem of complicated production process and requirements for large-scale facilities such as a clean room. In recent years, to make up for the disadvantage of the organic TFT element manufacturing process based on the conventional photolithographic process, there is a very active effort going on for research and development of the organic TFT element using an organic semiconductor material (Japanese Laid-Open Patent Publication H10-190001, Journal of Advanced Material, 2002, No. 2, P. 99 (Review)).

The organic TFT can be manufactured, for example, as follows, although it depends on the type of element structures: In the case of a bottom gate-bottom contact structure wherein the gate electrode is formed on the substrate, a gate electrode is formed on the substrate using the photolithography. After that, a gate insulation film is formed on the gate electrode by plasma CVD using a TEOS source, or the coated insulation material is formed by printing.

Then the source electrode and drain electrode are formed by photolithography. After that, an organic semiconductor layer is formed on the channel area between the source electrode and drain electrode.

The organic semiconductor layer is formed by vapor deposition under vacuum. The problem is that the organic TFT having been manufactured is expensive due to high costs of the production equipment. To solve this problem, the film is formed by coating the dispersion solution obtained by dispersing the organic semiconductor material in a solvent, or the solution obtained by dissolving the organic semiconductor material. Spin coating method or inkjet method is used for this coating. Further, micro-contact printing method is also being studied.

Generally, when an organic semiconductor layer is formed, it is important that the semiconductor layer should be formed so as to minimize the contact resistance between the organic semiconductor layer and source electrode or drain electrode, thereby obtaining an organic TFT characterized by a higher degree of mobility and smaller variation.

To solve the aforementioned problem, the following method is proposed. The self-assembled monolayer of the thiol compound is formed on the surfaces of a source electrode and drain electrode. After that, the semiconductor portion is formed on the channel portion, whereby the contact resistance is reduced (for example, see the Official Gazettes of U.S. Pat. No. 6,335,539 and U.S. Pat. No. 6,569,707).

However, to form the self-assembled monolayer of thiol compound on the surfaces of the source electrode and drain electrode according to the method disclosed in the Official Gazettes of U.S. Pat. No. 6,335,539 and U.S. Pat. No. 6,569,707, it is necessary to take a step of immersing the source electrode and drain electrode in the thiol-containing solution and a step of drying the thiol. This takes a lot of time. Further, it is difficult to set the conditions for the processes of immersing and drying. Variations occur to the TFT characteristics due to a slight difference in the conditions. Such problems have been kept unsolved.

SUMMARY

The object of the present invention is to solve the aforementioned problems and to provide a method of manufacturing a high-performance and low-cost organic thin film transistor, as well as the organic thin film transistor. In view of forgoing, one embodiment according to one aspect of the present invention is a method of manufacturing an organic thin film transistor which has a gate electrode, a gate insulation layer, a semiconductor layer; a source electrode and a drain electrode on a substrate, the method comprising the step of:

forming the semiconductor layer by applying to the source electrode, the drain electrode and therebetween a semiconductor solution into which a self-assembled monolayer material and an organic semiconductor material are mixed.

According to another aspect of the present invention, another embodiment is an organic thin film transistor, comprising:

a gate electrode;

a gate insulation layer which is formed on the gate electrode;

a source electrode which is formed on the gate insulation layer;

a drain electrode which is formed on the gate insulation layer; and a semiconductor layer which is formed on the gate insulation layer by applying a semiconductor solution between the source electrode and the drain electrode, the semiconductor solution being a mixture of a self-assembled monolayer material and an organic semiconductor material.

According to another aspect of the present invention, another embodiment is a method of manufacturing an organic thin film transistor on an electrode formed on a substrate, the method comprising the steps of:

forming a semiconductor layer by applying to the electrode a semiconductor solution into which a self-assembled monolayer material, an organic semiconductor material and solvent are mixed; and yielding the self-assembled monolayer material on the electrode by evaporating the solvent.

DETAILED DESCRIPTION OF THE PREFERRED EMBODIMENT

The following describes the details of the present invention with reference to embodiment without the present invention being restricted thereto.

FIGS. 1a through 1k and 1m are explanatory diagrams representing the method of manufacturing the organic thin film transistor of the present invention (hereinafter referred to as "TFT"). Referring to the FIGS. 1a through 1k and 1m, the following sequentially describes the manufacturing method for forming a bottom gate type organic TFT provided with the source electrode 8 and the drain electrode 9, wherein a gate electrode 2b is provided on the substrate 1 and a gate insulation layer 7b and semiconductor layer 10 are further formed. The application of the present invention is not restricted to the bottom gate type. The present invention is applicable to any device configuration as exemplified by a top gate type, vertical type, and top-and-bottom type.

FIGS. 1a, 1c, 1e, 1g, 1i and 1k are plan views wherein the substrate 1 is viewed from the top. FIGS. 1b, 1d, 1f, 1h, 1j and 1m are cross sections taken along lines X-X' of FIGS. 1a, 1c, 1e, 1g, 1i and 1k.

The following describes the Steps S1 through S7 to give an example of the method of manufacturing the organic P TFT of the present invention:

S1 . . . A step of forming the resist layer 4 of each electrode pattern on the substrate 1 wherein a thin conductive film 2 is formed.

S2 . . . A step of etching the substrate 1.

S3 . . . A step of removing the resist layer 4 on the gate electrode 2b.

S4 . . . A step of forming the gate insulation layer 7.

S5 . . . A step of forming the source electrode 8 and the drain electrode 9

S6 . . . A step of forming the semiconductor layer 10 between the source electrode 8 and the drain electrode 9.

S7 . . . A step of yielding the self-assembled monolayer material in the semiconductor on the surfaces of the source electrode 8 and the drain electrode 9.

The following describes each of the steps:

S1 . . . A step of forming the resist layer 4 of each electrode pattern on the substrate 1 wherein a thin conductive film 2 is formed.

Figure 1A:
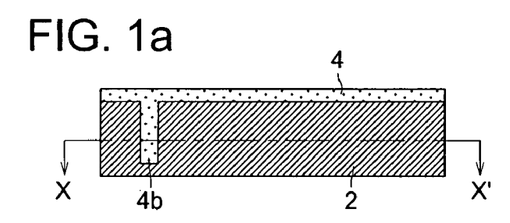
FIGS. 1a through 1k and 1m are explanatory diagrams representing the method of manufacturing the organic thin film transistor of the present invention.
Figure 1B:
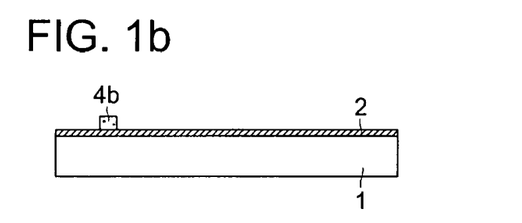

After a photosensitive resist is applied on the substrate 1 with the thin conductive film 2 formed thereon, exposure through the photomask of each electrode pattern and development are performed, thereby forming a resist layer 4 of each electrode pattern. In Step S1, the resist layer 4b is formed on the substrate 1, as shown in FIGS. 1a and 1b.

In the present invention, there is no restriction to the substrate 1. For example, glass or flexible resin sheet can be employed. For example, using the vapor deposition, sputtering or CVD method, the thin conductive film 2 can be made of the material of low-resistant metal such as Al, Cr, Ta, Mo and Ag as a thin conductive film on the substrate 1 and the laminated structure of these metals, and the material doped with other materials may be used as the thin conductive film for the purpose of improving the heat-resistance of the metallic thin film and contact with the supporting substrate and avoiding a possible defect. A transparent electrode of ITO, IZO, SnO and ZnO can also be used.

S2 . . . A step of etching the substrate 1.

Figure 1C:
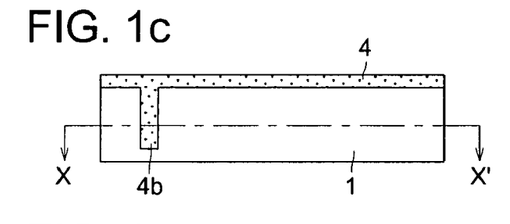
Figure 1D:
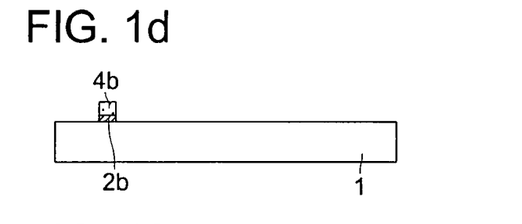

As shown in FIGS. 1c and 1d, the portion not covered by the resist layer 4 on the thin conductive film 2 is removed by etching the substrate 1.

S3 . . . A step of removing the resist layer 4 on the gate electrode 2b.

Figure 1E:
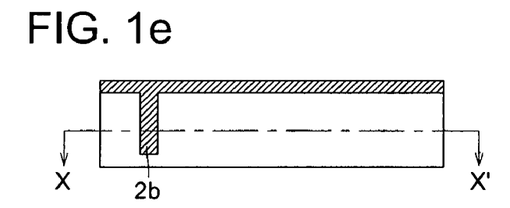
Figure 1F:
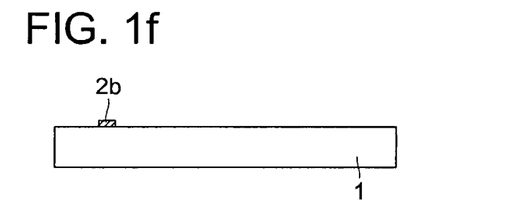

As shown in FIGS. 1e and 1f, the resist layer 4b on the gate electrode 2b is removed.

S4 . . . A step of forming the gate insulation layer 7.

Figure 1G:
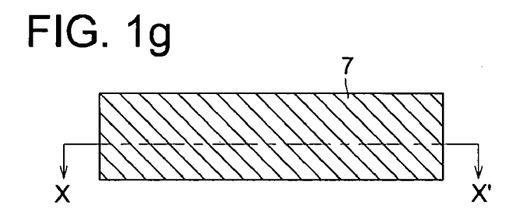
Figure 1H:
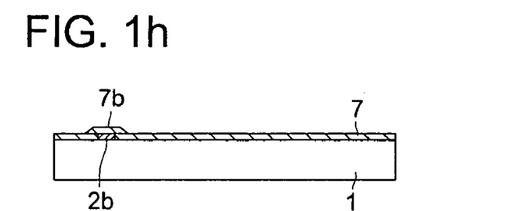

The gate insulation layer 7 is formed as shown in FIGS. 1g and 1h.

The gate insulation layer 7 is formed by a dry process of vapor deposition, sputtering, CVD method and atmospheric pressure plasma processing method. There is no restriction to materials for the gate insulation layer 7, and Various kinds of insulation films can be utilized. For example, the inorganic oxide coating of high relative dielectric constant such as silicon oxide, aluminum oxide, tantalum oxide and titanium oxide is employed.

Alternatively, an organic material such as a PVP, polyimide and polysiloxane type, and an inorganic membrane material can be used as a coating material.

S5 . . . A step of forming the source electrode 8 and the drain electrode 9.

Figure 1I:
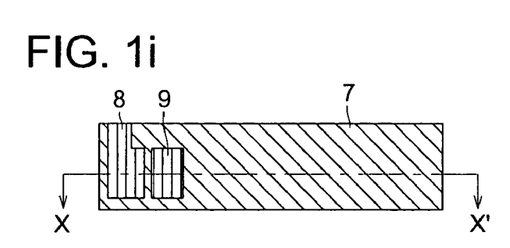
Figure 1J:
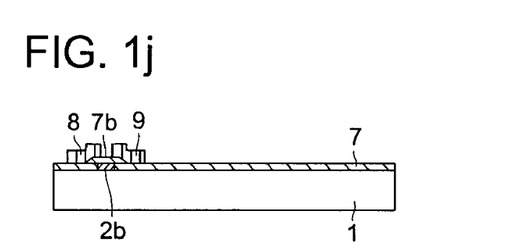

A source electrode 8 and drain electrode 9 are formed as shown in FIGS. 1n and 1j.

In the present invention, in the process of forming the semiconductor layer 10 in Step S6, the semiconductor solution made up of mixture of the self-assembled monolayer material and organic semiconductor material is coated to form a semiconductor layer 10, whereby a self-assembled monolayer is formed on the surface of the source electrode 8 and the drain electrode 9. Accordingly, at least the surfaces of the source electrode 8 and the drain electrode 9 are preferably made of a material having a higher degree of affinity with the self-assembled monolayer material. Gold, platinum, tungsten, palladium, aluminum, chromium and titanium can be mentioned as materials having a higher degree of affinity with the self-assembled monolayer material. The self-assembled layer used in the present embodiment is yielded on the surfaces of the source electrode 8 and the drain electrode 9 so as to reduce the electric resistance between the electrode and semiconductor layer. Application of the material used in the present invention is not restricted to the self-assembled layer. Other material can be used if it is capable of reducing the electric resistance between the electrode and the semiconductor layer.

The source electrode 8 and drain electrode 9 are formed, for example, by sputtering these materials. In this case, the source electrode 8 and the drain electrode 9 need not be integrally formed by these materials. It is sufficient if at least the surfaces are made of these materials.

S6 . . . A step of forming the semiconductor layer 10 between the source electrode 8 and the drain electrode 9.

Figure 1K:
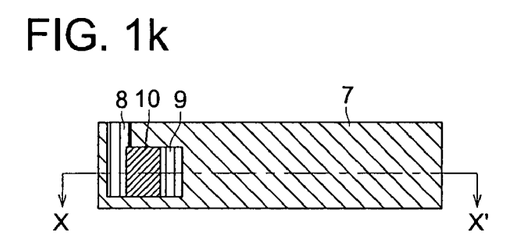
Figure 1M:
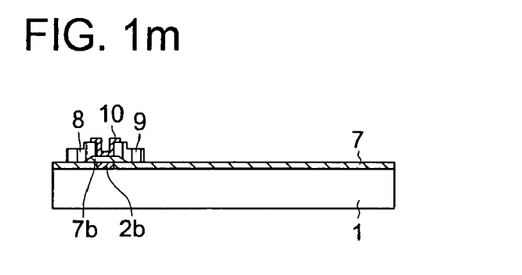

As shown in FIGS. 1*k* and 1*m*, a semiconductor layer 10 is formed so as to make electric connection with the source electrode 8 and the drain electrode 9 formed on the substrate 1, and to contact the gate insulation layer 7*b*.

In the present invention, as described above, the semiconductor layer 10 is formed by coating the semiconductor solution of a mixture of the self-assembled monolayer material and organic semiconductor material.

As described in the structural formula of Formula 1, the self-assembled monolayer material applicable to the present invention is preferably the material containing a thiol group. R in Formula 1 indicates the aromatic compound containing the straight chain or branched chain alkyl, alkenyl, cycloalkyl or 6 through 25 carbon atoms.

Formula 1 where R indicates the aromatic compound containing the straight chain or branched chain alkyl, alkenyl, cycloalkyl or 6 through 25 carbon atoms, and SH denotes a thiol group.

The self-assembled monolayer material containing the thiol group applicable to the present invention is typically represented by 3,4-dichlorobenzenethiol, pentafluoro benzenethiol, 1-hexadecanethiol. The structural formula of each material is shown below:

3,4-dichlorobenzenethiol

[Chemical Formula 1]

Pentafluoro benzenethiol

[Chemical Formula 2]

1-hexadecanethiol

[Chemical Formula 3]

4-nitrobenzenethiol, 2-mercaptobenzimidazole and 1-ocadecanethiol can be mentioned as a self-assembled monolayer material preferably applied to the present invention. The structural formula of the 4-nitrobenzenethiol and 2-mercaptobenzimidazole is given below:

4-nitrobenzenethiol

[Chemical Formula 4]

2-mercaptobenzimidazole

[Chemical Formula 5]

In addition to the thiol compound, a material capable of forming a self-assembled monolayer such as a silane coupling material can be used. The silane coupling material is preferably exemplified by octadesyl trichlorosilane and octyltrichlorosilane.

There is no restriction to the material of the organic semiconductor material as long as dissolution or dispersion in a solvent can be achieved. Taking the organic high molecular material for granted, pentacene which is a low molecular material can be dissolved in a heated solvent and can be coated, in recent years. The organic semiconductor material can be either a low- or high-molecular material.

The organic semiconductor material that can be coated is typically represented by bis(triisopropylsilylethynyl) pentacene, bis(triethylsilylethynyl) anthradithiophene and poly-3-hexylthiophene. The structural formula is given below:

Bis(triisopropylsilylethynyl) pentacene

[Chemical Formula 6]

Bis (triethylsilylethynyl) anthradithiophene

[Chemical Formula 7]

Poly-3-hexylthiophene

[Chemical Formula 8]

Even the organic semiconductor material other than the above can be used if it can be dissolved in the organic solvent. For example, polyolefin based F8T2 or the thiophene based material disclosed in the Japanese Laid-Open Patent Publication No. 2004-186695 can be selected.

Toluene is a typical solvent used to prepare a semiconductor solution as a mixture of self-assembled monolayer material and organic semiconductor material. Chloroform, xylene, tetrahydronaphthalene, dichlorobenzene or trichlorobenzene can be selected as a solvent.

For example, 3,4-dichlorobenzenethiol at a concentration of 0.005% by mass as a self-assembled monolayer material and bis(triisopropylsilylethynyl) pentacene at a concentration of 0.1% by mass as an organic semiconductor material are mixed and dissolved in toluene. The semiconductor solution prepared by this procedure is coated between the source electrode 8 and the drain electrode 9 by the dispenser method, whereby a semiconductor layer 10 is formed.

The semiconductor layer 10 can be formed by the spin coating method, inkjet method or microcontact printing method in addition to the dispenser method. There is no restriction to the method of formation. Any method can be applied to the present invention if the organic semiconductor material together with solvent is coated and is then dried, whereby a semiconductor layer is formed.

S7 . . . A step of yielding the self-assembled monolayer material in the semiconductor solution on the surfaces of the source electrode 8 and the drain electrode 9.

The following describes the Step S7 wherein the self-assembled monolayer material in the semiconductor solution are yielded on the surfaces of the source electrode 8 and the drain electrode 9 after coating, in Step S6, the semiconductor solution prepared by mixing the self-assembled monolayer material with organic semiconductor material.

Figure 2A:
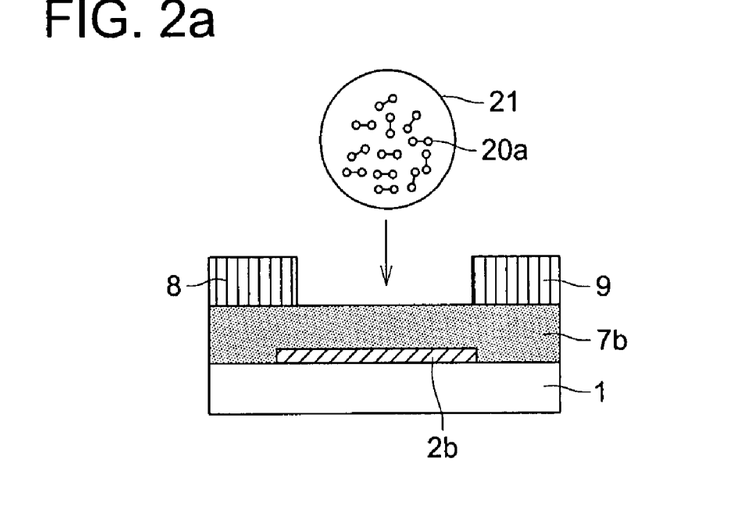
FIGS. 2a through 2c are explanatory diagrams schematically showing how self-assembled monolayer material is deposited on the surfaces of a source electrode 8 and drain electrode 9.
Figure 2B:
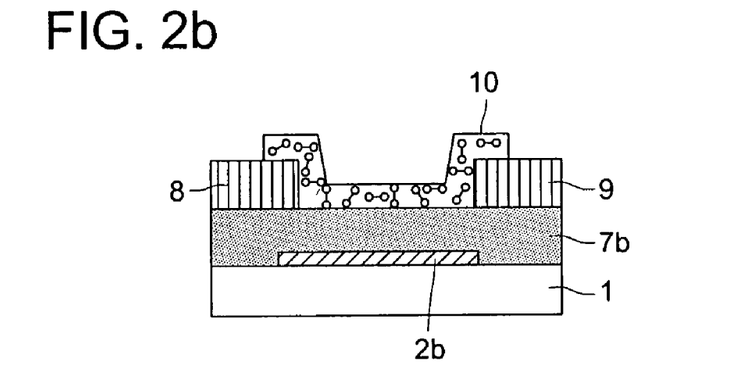
Figure 2C:
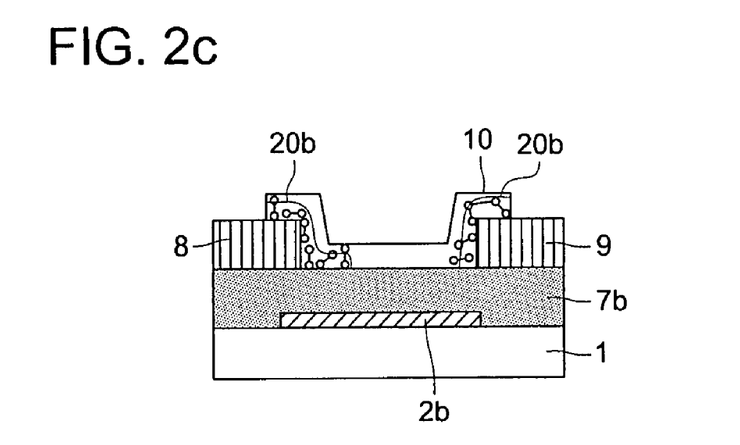

FIGS. 2a, 2b and 2c are explanatory diagrams schematically showing how the self-assembled monolayer material is yielded on the surfaces of the source electrode 8 and the drain electrode 9.

FIG. 2a is a schematic diagram wherein the space between the source electrode 8 and the drain electrode 9 in the cross section given in FIG. 1j is partially enlarged. Further, FIG. 2b and FIG. 2c are schematic diagrams wherein the portion between the source electrode 8 and the drain electrode 9 of the cross section of FIG. 1m is partially enlarged.

FIG. 2a shows that the semiconductor solution prepared by mixing the self-assembled monolayer material with organic semiconductor material in Step S6 is dropped in the arrow-marked direction in the drawing. The reference numeral 21 denotes a drop of the semiconductor solution to be dropped, and 20a indicates the self-assembled monolayer material contained in the drop 21 of semiconductor solution.

FIG. 2b shows that the drop 21 of the semiconductor solution having dropped spreads over the surfaces of the source electrode 8 and the drain electrode 9 through the action of the self-assembled monolayer material 20a, whereby a semiconductor layer 10 is formed.

FIG. 2c shows that the self-assembled monolayer material 20a is deposited on the surfaces of the source electrode 8 and the drain electrode 9 to form a self-assembled monolayer 20b, in Step S7. As described above, when the self-assembled monolayer material 20a is yielded onto the electrode surface, there will be a reduction in contact resistance between the semiconductor portion of the semiconductor layer 10 and the electrode, whereby an organic TFT characteristics of a high degree of mobility and performance can be produced.

In Step S7, it is also possible to make such arrangements that the solvent of the semiconductor solution coated in Step S6 by natural drying is evaporated and the self-assembled monolayer material in the semiconductor solution is yielded on the surfaces of the source electrode 8 and the drain electrode 9, as shown in FIG. 2c.

More preferably, gas is blown on the substrate 1 so that the solvent of semiconductor solution is evaporated, and the self-assembled monolayer material 20a is yielded on the surfaces of the source electrode 8 and the drain electrode 9. This allows the organic TFT on the substrate 1 to be dried under constant conditions, thereby reducing the variation in the characteristics of the manufactured organic TFT having been produced.

Still more preferably, a gas heated to a predetermined temperature is blown on the substrate 1 heated to a predetermined temperature, and the self-assembled monolayer material 20a is yielded on the surfaces of the source electrode 8 and the drain electrode 9. This allows the organic TFT on the substrate 1 to be dried in a shorter time. This procedure reduces the variation in the characteristics of the organic TFT having been produced.

Figure 3A:
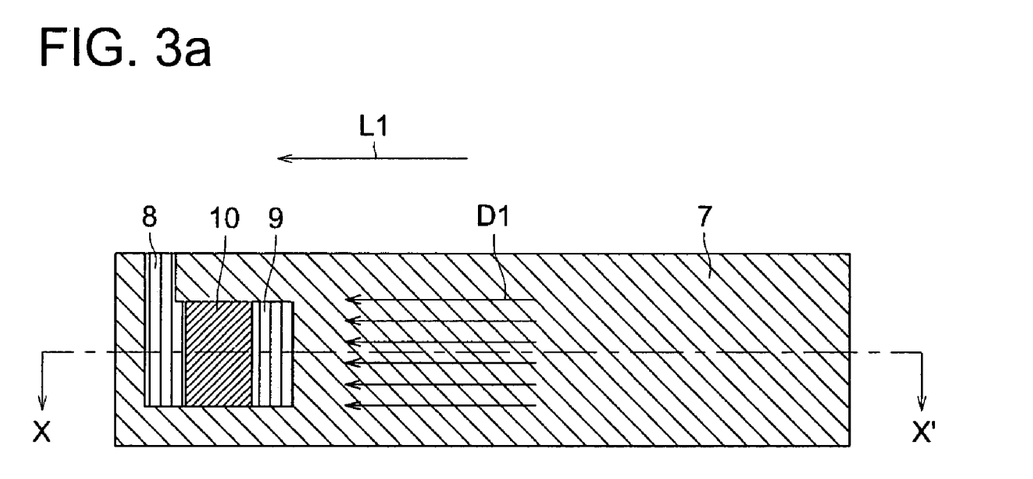
FIGS. 3a and 3b are explanatory diagrams showing the step of drying the semiconductor layer 10 formed between the source electrode 8 and the drain electrode 9.
Figure 3B:
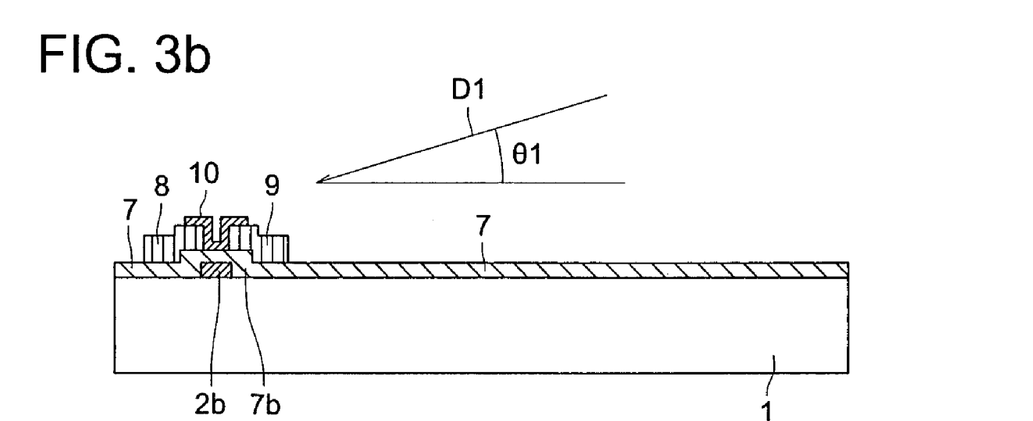

Referring to FIGS. 3a and 3b, the following describes the method of blowing, in Step S7, gas to evaporate the solvent of the semiconductor layer 10 formed in Step S6.

FIGS. 3a and 3b are explanatory diagrams showing the process of drying the semiconductor layer 10 formed between the source electrode 8 and the drain electrode 9 explained with reference to FIGS. 1k and 1m. The same reference numerals are assigned to the same components as those of FIGS. 1k and 1m, and the description is therefore omitted. FIG. 3a is a front view, and FIG. 3b is a cross section showing the cross sectional view of FIG. 3a taken along arrow line X-X'.

The arrow mark L1 of FIG. 3a denotes the direction wherein the substrate 1 is conveyed.

The arrow mark D1 of FIG. 3b indicates the direction wherein gas is blown from an air blower 31 (not illustrated) in order to evaporate the solvent of the semiconductor layer 10 formed on the substrate 1. Further, θ1 indicates the angle of blowing gas from the substrate 1.

The gas blowing direction is not restricted to the example of FIG. 3b. Gas can be blown immediately from the top, or parallel to or perpendicular to the traveling direction of the substrate. However, gas is preferably blown in the same direction as the traveling direction of the substrate 1, thereby drying the substrate.

The angle θ1 of the gas blown on the substrate 1 may be 90°. To be more specific, gas may be blown on the substrate 1 immediately from the top. Solvent can also be evaporated when this angle θ1 is 0 degree with respect to the substrate 1, viz., when gas is blown parallel to the substrate. When the θ1 is approximately 30°, the solvent can be evaporated in the shortest time. The θ1 is preferably 45° or less, more preferably approximately 30°.

Nitrogen or rare gas is preferably used for drying. Further, gas temperature is from the room temperature to about 200° C. Gas temperature depends on the heat resistant temperature of the solvent and organic semiconductor material. It is lower when using the solvent of higher volatility, and is higher when using the solvent of higher boiling point and lower volatility.

Gas temperature must be lower than the temperature wherein the organic semiconductor material is decomposed. If there is no influence upon other members, the temperature may be higher than the softening point of the organic semiconductor material. There is no restriction to the shape of the gas nozzle. The gas nozzle is preferably shaped to blow out gas in a linear shape.

The flow rate of gas per unit time is preferably 0.5 L/(min·mm$^2$) or more although it depends on the solvent to be evaporated. The gas speed can be slower in the beginning, and can be increased with the progress of drying.

Gas can be blown in such a way that the member linearly blowing out gas moves parallel to the substrate 1 so that gas is blown all over. The member for linear blowing of gas may be fixed in position, and the table holding the substrate may be moved. Both may be moved or fixed.

After Step S7, an insulating thin film and contact hole are formed. A pixel electrode is formed by the coating type ITO, thereby completing production of the organic TFT.

The embodiment of the present invention allows stable formation of the self-assembled monolayer on the electrode surface in a shorter period of time, and hence provides a method of manufacturing an organic thin film transistor characterized by low costs and high performances, as well as the organic thin film transistor.

EXAMPLE

The following describes the examples of the tests conducted to verify the effects of the present invention without the present invention being restricted thereto.

In Examples 1 through 7, only the conditions of the steps to be compared are changed, without the conditions for other steps being changed. The test conditions in each step of Example 1 will be explained. After that, the steps under the same conditions will not be described to avoid duplication. Only the different conditions will be described.

In Examples 1 through 7, a total of 25 organic TFT (5 by 5) were manufactured on the substrate 1, and the effects were verified.

Example 1

[Manufacturing the Organic TFT]

This TFT was manufactured in Steps S1 through S6 described with reference to FIGS. 1a through 1k and 1m. Accordingly, steps will be numbered, and will be described in sequence. However, description of the common items will be omitted.

S1: The substrate 1 used is the glass substrate having dimensions of 150 mm×150 mm wherein the AlNd (alumineodymium) film as a thin conductive film 2 was formed on the surface to a thickness of 125 nm. A resist was formed on this substrate 1 to a thickness of approximately 1 μm, and exposure and development were carried out.

S2: A step of etching an ALNd film

S3: A step of removing a resist layer 4 from the gate electrode 2b

S4: A step of forming a SiO$_2$ film as a gate insulation layer 7 on the substrate 1 to a thickness of 500 nm according to the plasma CVD method using a TEOS (tetraethoxysilane) gas.

S5: After cleaning, a positive resist thin film was formed on the gate insulation layer 7 to a thickness of approximately 1 μm, and exposure was conducted using a photomask having a pattern obtained by reversing the shapes of the source electrode 8 and the drain electrode 9. Then development is carried out and the resist is removed from only the position wherein the source electrode 8 and the drain electrode 9 are to be provided. The resist is kept un-removed where these electrodes are not to be provided. An Au film is formed to a thickness of approximately 50 nm by sputtering, whereby the source electrode 8 and the drain electrode 9 are formed. The resist is then removed.

S6: An adequate quantity of the semiconductor solution of the following composition was dropped on the gate insulation layer 7b between the source electrode 8 and the drain electrode 9 by the dispenser method.

Self-assembled monolayer material: 0.005% by mass of 3,4-dichlorobenzenethiol

Organic semiconductor material: 0.1% by mass of bis(triisopropylsilylethynyl) pentacene Solvent: toluene Channel: 1000 μm wide and 100 μm long Thickness of semiconductor material between the source electrode 8 and the drain electrode 9 after being dried: 60 nm S7: The self-assembled monolayer material 20a was yielded on the surfaces of the source electrode 8 and the drain electrode 9 by natural drying method.

Example 2

The semiconductor solution of the following composition was used in Step S6.

S6: An adequate quantity of the semiconductor solution of the following composition was dropped on the gate insulation layer 7b between the source electrode 8 and the drain electrode 9 by the dispenser method.

Self-assembled monolayer material: 0.005% by mass of pentafluorobenzenethiol

Organic semiconductor material: 0.1% by mass of bis(triisopropylsilylethynyl) pentacene Solvent: toluene Channel: 1000 μm wide, 100 μm long Thickness of semiconductor material after drying between the source electrode 8 and the drain electrode 9: 60 nm

Example 3

The semiconductor solution of the following composition was used in Step S6.

S6: An adequate quantity of the semiconductor solution of the following composition was dropped on the gate insulation layer 7b between the source electrode 8 and the drain electrode 9 according to the dispenser method.

Self-assembled monolayer material: 0.005% by mass of 1-hexadecanethiol
Organic semiconductor material: 0.1% by mass of bis(triisopropylsilylethynyl) pentacene
Solvent: toluene
Channel: 1000 μm wide, 100 μm long
Thickness of the semiconductor material between source electrode 8 and drain electrode 9 after drying: 60 nm

Example 4

The semiconductor solution of the following composition was used in Step S6.

S6: An adequate quantity of semiconductor solution of the following composition is dropped on the gate insulation layer 7b between the source electrode 8 and the drain electrode 9 according to the dispenser method.

Self-assembled monolayer material: 0.005% by mass of 3,4-dichlorobenzenethiol
Organic semiconductor material: 0.1 by mass of bis(triethylsilylethynyl) anthradithiophene
Solvent: toluene
Channel: 1000 μm wide, 100 μm long
Thickness of semiconductor material after drying between the source electrode 8 and the drain electrode 9: 60 nm

Example 5

In Step S6, the semiconductor solution of the following composition was used.

S6: An adequate quantity of the semiconductor solution of the following composition was dropped on the gate insulation layer 7b between the source electrode 8 and the drain electrode 9 according to the dispenser method.

Self-assembled monolayer material: 0.005% by mass of 3,4-dichlorobenzenethiol
Organic semiconductor material: 0.1% by mass of poly-3-hexylthiophene
Solvent: toluene
Channel: 1000 μm wide, 100 μm long
Thickness of semiconductor material after drying between the source electrode 8 and the drain electrode 9: 60 nm

Example 6

Procedures up to the Step S6 were performed under the same conditions as those of the Example 1. In Step S7, gas was blown on the substrate 1 so that the self-assembled monolayer material was deposited on the surfaces of the source electrode 8 and the drain electrode 9.

S7: The substrate 1 was placed on the drying table, and was dried by an air blower. The air blower is fixed and the table is moved, whereby air was blown all over and solvent was evaporated.

Gas blown from air blower 31: nitrogen gas
Gas flow rate: 2.0 L/(min.·mm$^2$)
Gas temperature: 25° C.
Table temperature: 25° C.
Table traveling speed: approximately 2 m/min.
Direction of gas blow: L1 (shown in FIG. 3a)
Gas blow angle θ1: 30°

Example 7

Procedures up to the Step S6 were performed under the same conditions as those of the Example 6. In Step S7, gas temperature and table temperature are different from those of the Example 6.

S7: A substrate 1 was placed on the drying table and was dried by an air blower. The air blower was fixed in position and the table was moved to blow air over the entire area, whereby solvent was evaporated.

Gas blow from air blower 31: nitrogen gas
Gas flow rate: 2.0 L/(min. ·mm$^2$)
Gas temperature: 80° C.
Table temperature: 80° C.
Table traveling speed: approximately 2 m/min.
Direction of gas blow: L1 (shown in FIG. 3a)
Gas blow angle θ1: 30°

Comparative Example 1

In Comparative Example 1, to verify the effects of the present invention, a self-assembled monolayer was formed on the surfaces of the source electrode and drain electrode by the Step S100 of immersing in the solution containing a self-assembled monolayer material and the Step S101 of drying the solution containing a self-assembled monolayer material. After that, a semiconductor layer 10 was formed between the source electrode 8 and the drain electrode 9, whereby an organic TFT was manufactured.

Up to Step S5, the same conditions as those of Example 1 were used for production, and therefore, the description will be omitted. The following description starts from the Step S100 for immersion in the solution containing the self-assembled monolayer material.

S100: The substrate 1 having completed the process up to S5 was immersed in the following solution.

Self-assembled monolayer material: 0.005% by mass of 3,4-dichlorobenzenethiol
Solvent: ethanol S101: The substrate 1 having been processed in the Step S100 was dried in an oven having a temperature of 30° C. for five minutes.

S6: An adequate quantity of the semiconductor solution of the following compositions was dropped on the gate insulation layer 7b between the source electrode 8 and the drain electrode 9 by the dispenser method.

Organic semiconductor material: 0.1% by mass of bis(triethylsilylethynyl) anthradithiophene
Solvent: toluene
Channel: 1000 μm wide, 100 μm long
Thickness between source electrode 8 and drain electrode 9: 60 nm

[Test Result]

Table 1 shows the test result. Twenty-five organic TFT elements on the glass substrate manufactured by various conditions under this test were evaluated to check the mobility and ON/OFF current ratio (current value between source and drain when the organic TFT is on/current value between source and drain when the organic TFT is off).

TABLE 1

| | | Example 1 | Example 2 | Example 3 | Example 4 | Example 5 | Example 6 | Example 7 | Comp. 1 |
|---|---|---|---|---|---|---|---|---|---|
| Mobility ($cm^2/V \cdot S$) | Average value | 0.014 | 0.013 | 0.01 | 0.011 | 0.012 | 0.031 | 0.045 | 0.004 |
| | Standard deviation | 0.004 | 0.0036 | 0.0036 | 0.0042 | 0.0033 | 0.0010 | 0.0007 | 0.0099 |
| | *1 | 0.2857 | 0.2792 | 0.3590 | 0.3800 | 0.2733 | 0.0324 | 0.0160 | 2.4850 |
| On/off current ratio | Average value | 3.60E+04 | 3.20E+04 | 2.00E+04 | 1.90E+04 | 1.31E+04 | 6.99E+04 | 1.44E+05 | 1.40E+04 |
| | Standard deviation | 11700 | 14700 | 9238 | 9186 | 8872 | 3446 | 4872 | 48371 |
| | *1 | 0.33 | 0.46 | 0.46 | 0.48 | 0.68 | 0.05 | 0.03 | 3.46 |

*1: Standard deviation/average value,
Comp.: Comparative example

All the organic TFTs manufactured in Examples 1 through 7 were superior to those produced in Comparative Example 1 in both the average value of mobility and the standard deviation/average value of mobility. This has verified that an organic TFT characterized by high mobility and smaller variations could be manufactured. Further, the organic TFTs manufactured in Examples 1 through 7 were characterized by a higher ON/OFF current ratio and smaller variation. These organic TFTs have been verified to have excellent performances.

In the organic TFT manufactured in the Examples 1 through 5 wherein tests were conducted by changing the compositions of the semiconductor solution, mobility was almost the same without a big difference. In the meantime, in the Example 6 wherein procedures up to Step S6 were carried out under the same conditions as those of Example 1 and gas was blown on the substrate 1 in Step S7, the organic TFT having been manufactured had the mobility which was approximately 2.2 times as high as that of Example 1, and standard deviation/average value of mobility which was as low as approximately 1/10. This has proved that, when gas is blown on the substrate 1 in Step S7, an organic TFT characterized by higher mobility and smaller variation can be produced.

Further, comparison between the Example 7 and Example 6 indicates that the organic TFT manufactured in the Example 7 had the mobility which was approximately 1.5 times as high as that manufactured in the Example 6, and the standard deviation/average value of mobility which was approximately 1/2. This shows that, when the substrate 1 and gas in Step S7 are heated, an organic TFT characterized by still higher mobility and smaller variation can be obtained.

As described above, the present invention allows stable formation of the self-assembled monolayer on the electrode surface in a shorter period of time, and hence provides a method of manufacturing an organic thin film transistor characterized by low costs and high performances, as well as the organic thin film transistor.

What is claimed is:

1. A method of manufacturing an organic thin film transistor which has a gate electrode, a gate insulation layer, a semiconductor layer, a source electrode and a drain electrode on a substrate, the method comprising the step of:
    forming the semiconductor layer by applying to the source electrode, the drain electrode and therebetween a semiconductor solution into which a self-assembled monolayer material and an organic semiconductor material are mixed.

2. The method of manufacturing an organic thin film transistor of claim 1, wherein the self-assembled monolayer material has a molecular structure represented by the following formula:

R—SH wherein:
    R is an aromatic compound containing a straight chain or branched chain alkyl, alkenyl, cycloalkyl or 6 through 25 carbon atoms;
    SH is a thiol group.

3. The method of manufacturing an organic thin film transistor of claim 1, comprising the step of:
    yielding the self-assembled monolayer material on the source electrode and the drain electrode after applying to the source electrode, the drain electrode and therebetween the semiconductor solution into which the self-assembled monolayer material and the organic semiconductor material are mixed.

4. The method of manufacturing an organic thin film transistor of claim 3, wherein the step of yielding the self-assembled monolayer material comprises the step of blowing a gas on a surface of the substrate on which the semiconductor solution has been applied.

5. The method of manufacturing an organic thin film transistor of claim 4, wherein the step of yielding the self-assembled monolayer material comprises the step of blowing a heated gas on a surface of a heated substrate on which the semiconductor solution has been applied.

6. An organic thin film transistor, comprising:
    a gate electrode;
    a gate insulation layer which is formed on the gate electrode;
    a source electrode which is formed on the gate insulation layer;
    a drain electrode which is formed on the gate insulation layer; and
    a semiconductor layer which is formed on the gate insulation layer by applying a semiconductor solution between the source electrode and the drain electrode, the semiconductor solution being a mixture of a self-assembled monolayer material and an organic semiconductor material.

7. The organic thin film transistor of claim 6, surfaces of the source electrode and the drain electrode is formed of a material selected from the group consisting of gold, platinum, tungsten, palladium, aluminum, chrome and titanium.

8. The method of manufacturing an organic thin film transistor of claim 1, wherein the semiconductor solution contains a solvent, and the method comprises the step of yielding the self-assembled monolayer material on the source electrode and the drain electrode by evaporating the solvent.

9. The method of manufacturing an organic thin film transistor of claim 8, wherein the step of yielding the self-assembled monolayer material includes the step of evaporating the solvent by blowing a gas on the applied semiconductor solution.

10. The method of manufacturing an organic thin film transistor of claim 9, wherein the gas is blown at an angle of 30° from a surface of the substrate.

11. A method of manufacturing an organic thin film transistor on an electrode formed on a substrate, the method comprising the steps of:

forming a semiconductor layer by applying to the electrode a semiconductor solution into which a self-assembled monolayer material, an organic semiconductor material and solvent are mixed; and yielding the self-assembled monolayer material on the electrode by evaporating the solvent.

12. The method of manufacturing an organic thin film transistor of claim 11, wherein the step of yielding the self-assembled monolayer material includes evaporating the solvent by blowing a gas on the applied semiconductor solution.

13. The method of manufacturing an organic thin film transistor of claim 12, wherein the gas is blown at an angle of 30° from a surface of the substrate.

14. The method of manufacturing an organic thin film transistor of claim 12, wherein the gas to be blown is a nitrogen gas or a rare gas.

15. The method of manufacturing an organic thin film transistor of claim 11, wherein the electrode to which the semiconductor solution is applied includes a source electrode and a drain electrode.

16. A method of manufacturing an organic thin film transistor which has a gate electrode, a gate insulation layer, a semiconductor layer, a source electrode and a drain electrode on a substrate, the method comprising the steps of:

forming the semiconductor layer by applying to the source electrode, the drain electrode and therebetween a semiconductor solution into which an organic semiconductor material, solvent and a material for decreasing an electric resistivity between the both electrodes and the semiconductor layer are mixed; and yielding the self-assembled monolayer material on the source electrode and the drain electrode by evaporating the solvent.

17. The method of manufacturing an organic thin film transistor of claim 16, wherein the material for decreasing the electric resistivity includes a self-assembled monolayer material.

18. The method of manufacturing an organic thin film transistor of claim 16, wherein the step of yielding the self-assembled monolayer material includes the step of evaporating the solvent by blowing a gas on the applied semiconductor solution.

19. The method of manufacturing an organic thin film transistor of claim 18, wherein the gas is blown at an angle of 30° from a surface of the substrate.

20. The method of manufacturing an organic thin film transistor of claim 18, wherein the gas to be blown is a nitrogen gas or a rare gas.

* * * * *